US012765317B2

(12) United States Patent
An et al.

(10) Patent No.: US 12,765,317 B2
(45) Date of Patent: Oct. 13, 2026

(54) SUBSTRATE PROCESSING APPARATUS AND SUBSTRATE PROCESSING METHOD

(71) Applicant: SEMES CO., LTD., Cheonan-si (KR)

(72) Inventors: Byungin An, Cheonan-si (KR); Tae Yong Kim, Gunpo-si (KR)

(73) Assignee: SEMES CO., LTD., Cheonan-si (KR)

( * ) Notice: Subject to any disclaimer, the term of this patent is extended or adjusted under 35 U.S.C. 154(b) by 420 days.

(21) Appl. No.: 18/375,168

(22) Filed: Sep. 29, 2023

(65) Prior Publication Data

US 2024/0128111 A1 Apr. 18, 2024

(30) Foreign Application Priority Data

Oct. 13, 2022 (KR) ........................ 10-2022-0131691

(51) Int. Cl.
*H10P 72/30* (2026.01)
*H10P 72/76* (2026.01)

(52) U.S. Cl.
CPC ...... *H10P 72/3311* (2026.01); *H10P 72/7602* (2026.01)

(58) Field of Classification Search
CPC .................... H01L 21/67754; H01L 21/67778
See application file for complete search history.

(56) References Cited

U.S. PATENT DOCUMENTS

| | | | | |
|---|---|---|---|---|
| 5,788,447 | A * | 8/1998 | Yonemitsu | H01L 21/67173 414/217 |
| 6,155,768 | A * | 12/2000 | Bacchi | H01L 21/68707 414/416.03 |
| 6,960,057 | B1 * | 11/2005 | Hofmeister | H01L 21/67766 414/744.5 |
| 7,604,449 | B1 * | 10/2009 | Kaveh | H01L 21/67775 414/411 |
| 11,883,958 | B2 * | 1/2024 | Muthukamatchy | H01L 21/0201 |
| 2020/0384634 | A1 * | 12/2020 | Muthukamatchy | H01L 21/02104 |
| 2022/0013385 | A1 * | 1/2022 | Endo | H01L 21/67766 |

FOREIGN PATENT DOCUMENTS

| | | | |
|---|---|---|---|
| JP | 2002-270669 | A | 9/2002 |
| JP | 2016-203362 | A | 12/2016 |
| KR | 10-0833286 | B1 | 5/2008 |
| KR | 10-1199733 | B1 | 11/2012 |

* cited by examiner

*Primary Examiner* — Jonathan Snelting
(74) *Attorney, Agent, or Firm* — Muir Patent Law, PLLC

(57) ABSTRACT

Provided is a substrate processing apparatus and substrate processing method capable of increasing utilization of equipment and minimizing a footprint of the equipment, the substrate processing apparatus including a load port module loaded with a first carrier in which first substrates are stored, a transfer robot for transferring the first substrates from the first carrier, a first adaptor region for temporarily storing the first substrates transferred by the transfer robot, a second adaptor region for temporarily storing second substrates transferred by the transfer robot from a second carrier loaded onto the load port module, after the first carrier is unloaded from the load port module, and a controller for applying a first substrate transfer control signal to the transfer robot to store the first substrates, which were temporarily stored in the first adaptor region and on which a process is completed, in the empty second carrier.

19 Claims, 15 Drawing Sheets

SUBSTRATE PROCESSING APPARATUS AND SUBSTRATE PROCESSING METHOD

CROSS-REFERENCE TO RELATED PATENT APPLICATION

This application claims the benefit of Korean Patent Application No. 10-2022-0131691, filed on Oct. 13, 2022, in the Korean Intellectual Property Office, the disclosure of which is incorporated herein in its entirety by reference.

BACKGROUND OF THE INVENTION

1. Field of the Invention

The present invention relates to a substrate processing apparatus and substrate processing method and, more particularly, to a substrate processing apparatus and substrate processing method capable of increasing utilization of equipment and minimizing a footprint of the equipment because the function of a dual loader is performed with one load port module by using an embedded dual adaptor.

2. Description of the Related Art

In general, prober equipment for performing an electrical test process on substrates such as wafers may include, for example, a load port module loaded with a carrier such as a cassette, a front opening unified pod (FOUP), or a front opening shipping box (FOSB), a transfer robot for transferring substrates from the load port module, and a test module for performing an electrical test process on the transferred substrates by using a probe card having a plurality of probes.

The existing prober equipment is operated using a so-called come back home method by which first substrates, which were stored in a first carrier loaded onto the load port module, are returned to the first carrier after the test is completed.

However, according to the come-back-home prober equipment, because the carrier must stay on the load port module until the substrates, which were originally stored in the carrier, are returned to the carrier, severe carrier congestion may occur and thus productivity may be greatly reduced. Even when a so-called dual loader including two or more load port modules to load two or more carriers is used to solve the above problem, many other problems may be caused. For example, a footprint of equipment may be increased, a cost may be significantly increased due to installation of additional load port modules, the number of carriers used may be greatly increased, and an internal transfer path, i.e., a loading and unloading path, of the substrates may be very complicated.

SUMMARY OF THE INVENTION

The present invention provides a substrate processing apparatus and substrate processing method capable of increasing utilization of equipment and minimizing a footprint of the equipment because substrates are returned to a next carrier other than a carrier where the substrates were originally stored, and the function of a dual loader is performed with one load port module by using an embedded dual adaptor. However, the above description is merely an example, and the scope of the present invention is not limited thereto.

According to an aspect of the present invention, there is provided a substrate processing apparatus including a load port module loaded with a first carrier in which first substrates are stored, a transfer robot for transferring the first substrates from the first carrier, a first adaptor region for temporarily storing the first substrates transferred by the transfer robot, a second adaptor region for temporarily storing second substrates transferred by the transfer robot from a second carrier loaded onto the load port module, after the first carrier is unloaded from the load port module, and a controller for applying a first substrate transfer control signal to the transfer robot to store the first substrates, which were temporarily stored in the first adaptor region and on which a process is completed, in the empty second carrier.

The controller may apply a third substrate transfer control signal to the transfer robot to transfer third substrates from a third carrier loaded onto the load port module, to the empty first adaptor region after the second carrier is unloaded from the load port module.

The controller may apply a second substrate transfer control signal to the transfer robot to store the second substrates, which were temporarily stored in the second adaptor region and on which a process is completed, in the empty third carrier.

The controller may apply a second substrate transfer control signal to the transfer robot to transfer the second substrates, which were temporarily stored in the second adaptor region and on which a process is completed, to the first carrier after the second carrier is unloaded from the load port module and the empty first carrier is loaded again.

The load port module may be a single load port module loaded with only one carrier at a time to reduce a footprint of equipment.

The transfer robot may be lifted or lowered from a height of the first carrier seated on the load port module to a height of the first adaptor region or a height of the second adaptor region.

The first and second adaptor regions may be disposed in a vertical direction to reduce a footprint of equipment.

The substrate processing apparatus may further include a test module for performing an electrical test process on the substrates by using a probe card having a plurality of probes.

The transfer robot may transfer the first substrates stored in the first adaptor region, to the test module and store the first substrates, on which a test process is completed, back in the first adaptor region, or transfer the second substrates stored in the second adaptor region, to the test module and store the second substrates, on which a test process is completed, back in the second adaptor region.

The first or second substrates may be wafers, and the first or second carrier may include at least one of a cassette, a front opening unified pod (FOUP), and a front opening shipping box (FOSB).

The first adaptor region may store a number of substrates greater than or equal to a maximum number of first substrates stored in the first carrier.

The first adaptor region may be rotated by a rotating device or lifted by a lifting device.

According to another aspect of the present invention, there is provided a substrate processing method including (a) primarily loading a first carrier in which first substrates are stored, onto a load port module, (b) transferring, by a transfer robot, the first substrates from the first carrier to a first adaptor region, (c) unloading the first carrier from the load port module, (d) secondarily loading a second carrier in which second substrates are stored, onto the load port module, (e) transferring, by the transfer robot, the second substrates from the second carrier to a second adaptor region, and (f) transferring, by the transfer robot, the first substrates of the first adaptor region, on which a process is completed, to the empty second carrier.

The substrate processing method may further include (g) unloading the second carrier from the load port module, (h) tertiarily loading a third carrier in which third substrates are stored, onto the load port module, and (i) transferring, by the transfer robot, the third substrates from the third carrier to the empty first adaptor region, after step (f).

The substrate processing method may further include (j) transferring, by the transfer robot, the second substrates of the second adaptor region, on which a process is completed, to the empty third carrier, after step (i).

The substrate processing method may further include (k) unloading the second carrier from the load port module, (l) loading the empty first carrier onto the load port module again, and (m) transferring, by the transfer robot, the second substrates of the second adaptor region, on which a process is completed, to the first carrier, after step (f).

In step (b), the transfer robot may be lifted or lowered from a height of the first carrier seated on the load port module to a height of the first adaptor region and, in step (e), the transfer robot may be lifted or lowered from a height of the second carrier seated on the load port module to a height of the second adaptor region.

The substrate processing method may further include (n) performing, by a test module, an electrical test process on the first substrates of the first adaptor region by using a probe card having a plurality of probes, after step (b).

In step (n), the transfer robot may transfer the first substrates stored in the first adaptor region, to the test module and store the first substrates, on which a test process is completed, back in the first adaptor region.

According to another aspect of the present invention, there is provided a substrate processing apparatus including a load port module loaded with a first carrier in which first substrates are stored, a transfer robot for transferring the first substrates from the first carrier, a first adaptor region for temporarily storing the first substrates transferred by the transfer robot, a second adaptor region for temporarily storing second substrates transferred by the transfer robot from a second carrier loaded onto the load port module, after the first carrier is unloaded from the load port module, and a controller for applying a first substrate transfer control signal to the transfer robot to store the first substrates, which were temporarily stored in the first adaptor region and on which a process is completed, in the empty second carrier, wherein the controller applies a third substrate transfer control signal to the transfer robot to transfer third substrates from a third carrier loaded onto the load port module, to the empty first adaptor region after the second carrier is unloaded from the load port module, and applies a second substrate transfer control signal to the transfer robot to store the second substrates, which were temporarily stored in the second adaptor region and on which a process is completed, in the empty third carrier, or applies a second substrate transfer control signal to the transfer robot to transfer the second substrates, which were temporarily stored in the second adaptor region and on which a process is completed, to the first carrier after the second carrier is unloaded from the load port module and the empty first carrier is loaded again.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
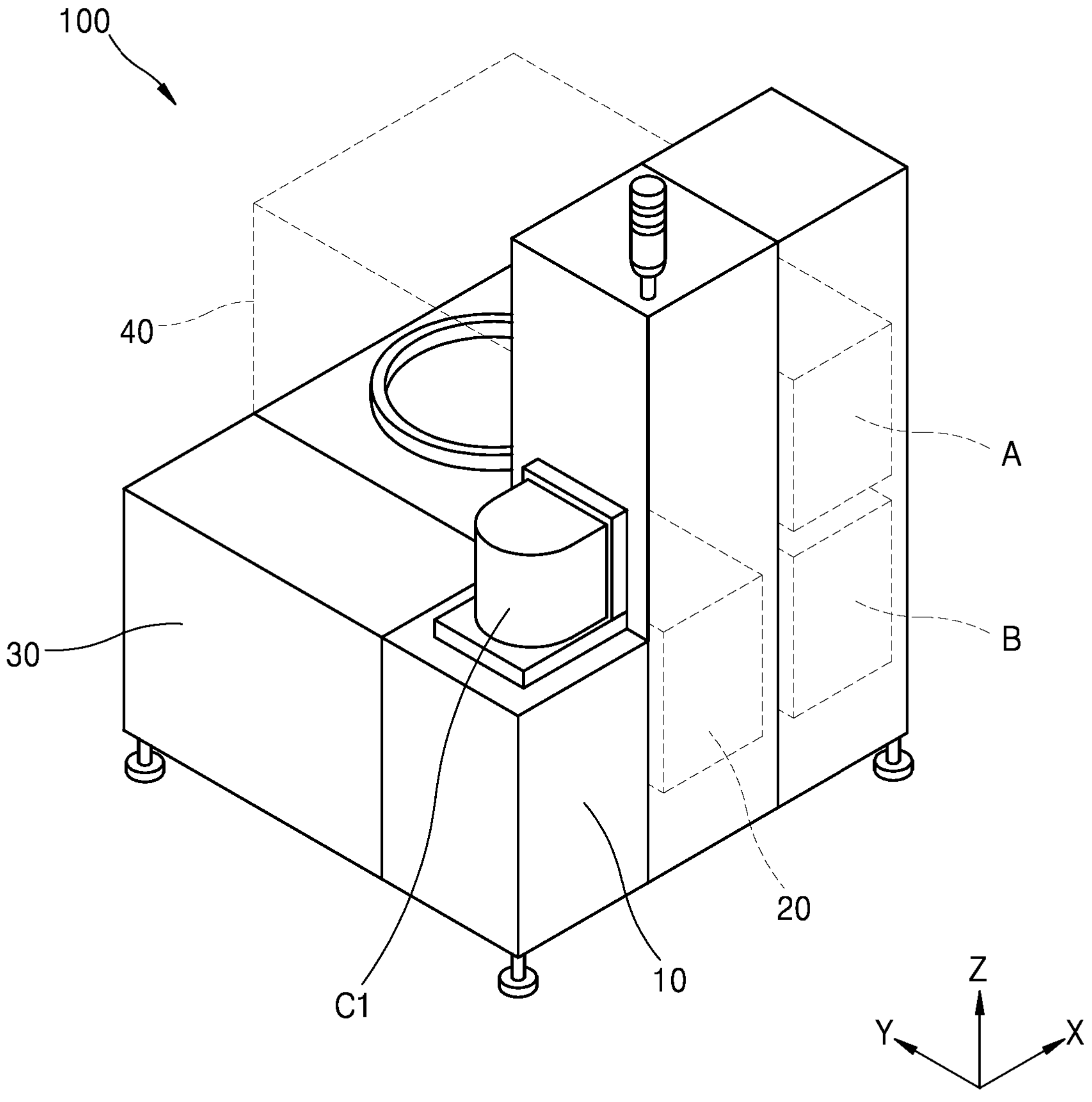
FIG. 1 is an external perspective view of a substrate processing apparatus according to some embodiments of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, components, and/or groups thereof, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

Figure 2:
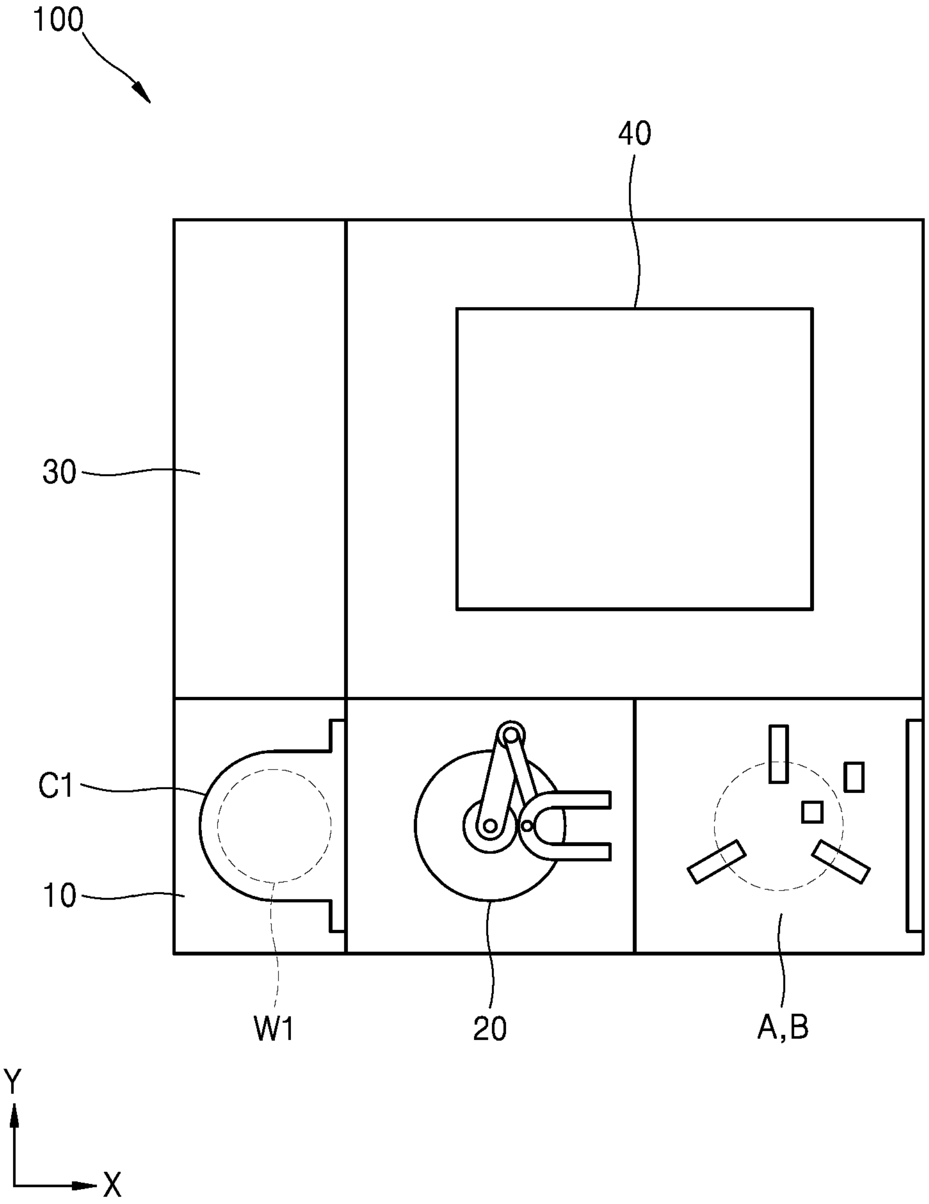
FIG. 2 is a horizontal cross-sectional view of the substrate processing apparatus of FIG. 1.
Figure 3:
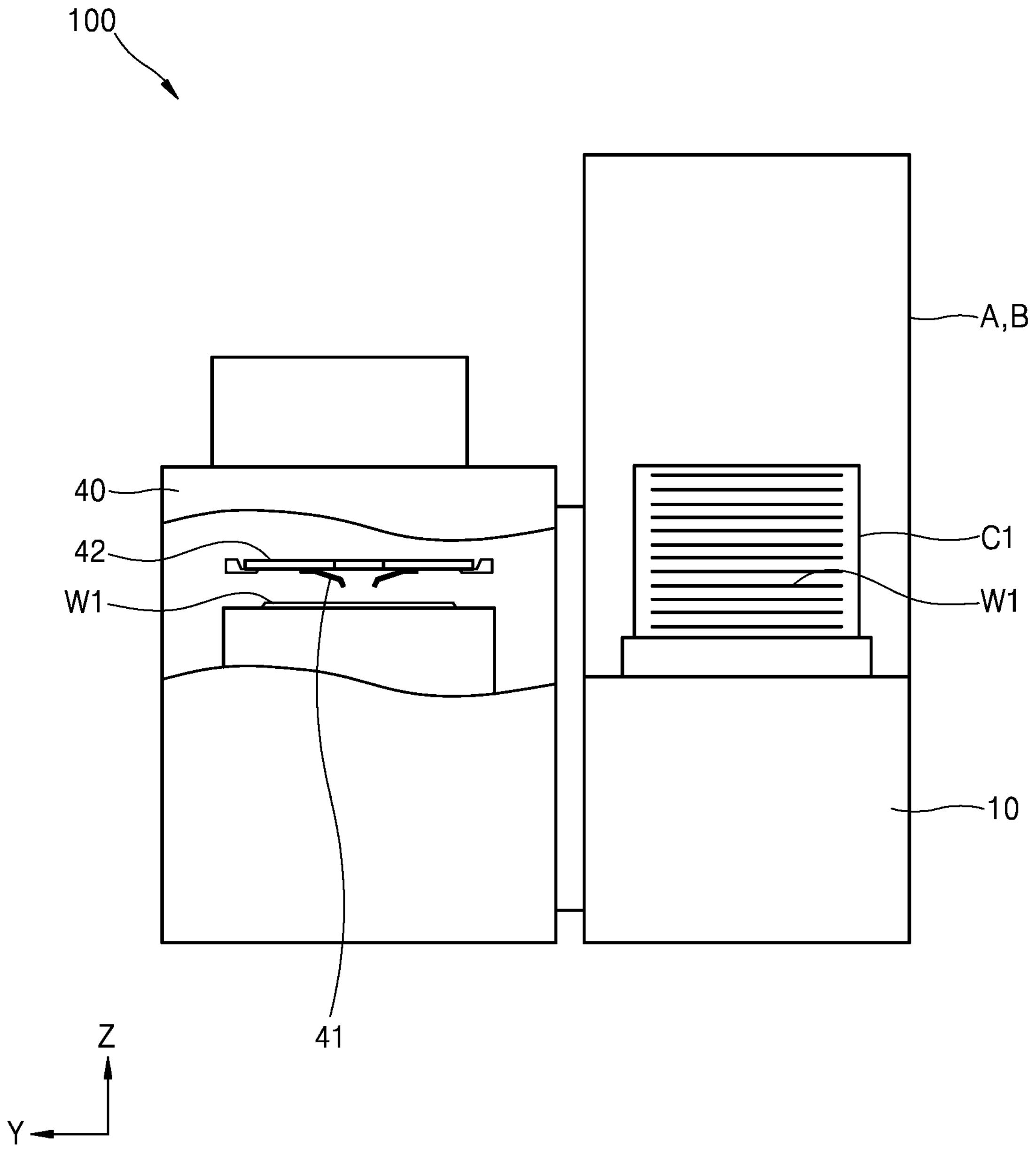
FIG. 3 is a vertical cross-sectional view of the substrate processing apparatus of FIG. 1.
Figure 4:
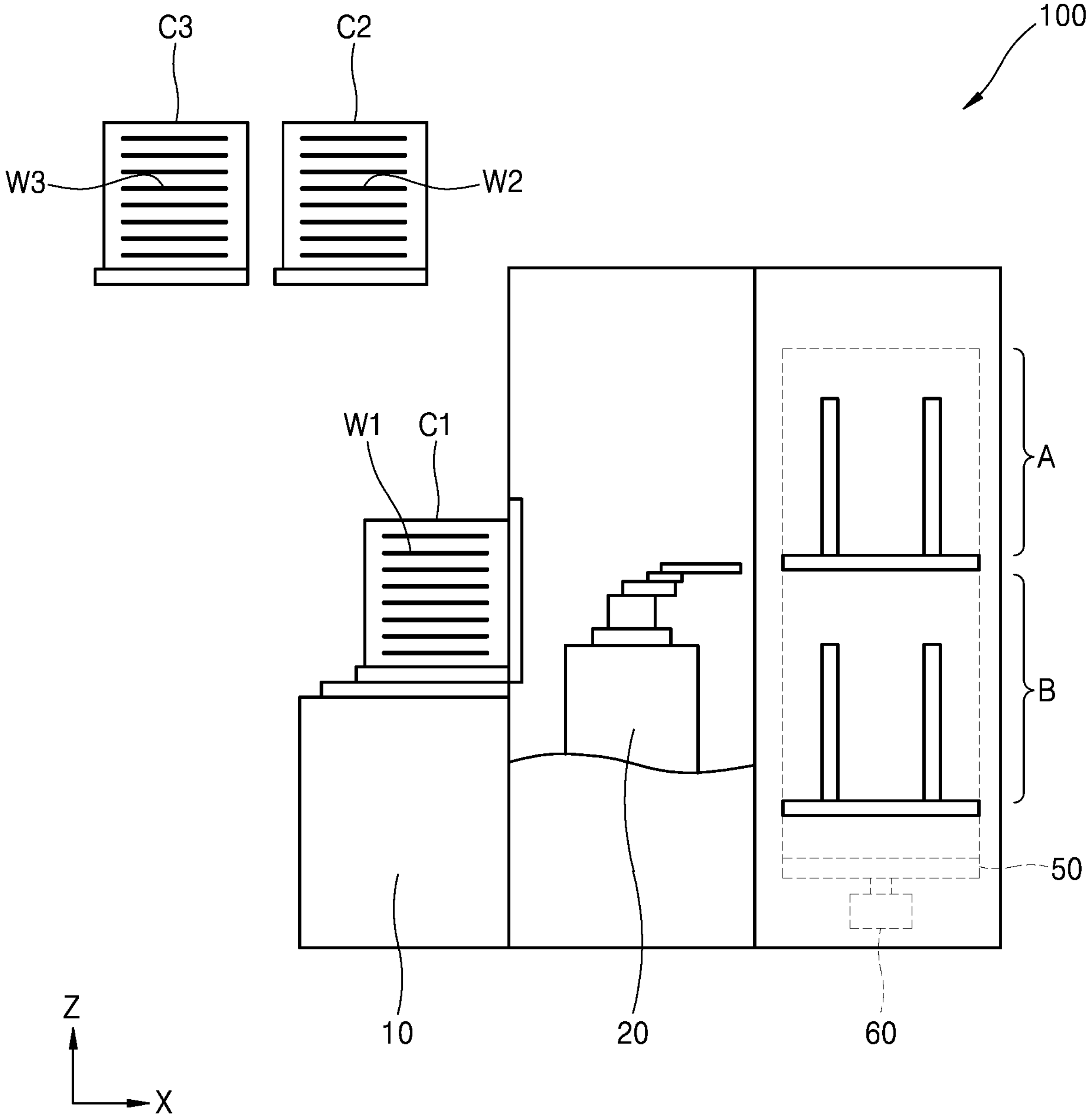
FIGS. 4 to 11 are side cross-sectional views showing operation of the substrate processing apparatus of FIG. 1 step by step.

FIG. 1 is an external perspective view of the substrate processing apparatus 100 according to some embodiments of the present invention, FIG. 2 is a horizontal cross-sectional view of the substrate processing apparatus 100 of FIG. 1, FIG. 3 is a vertical cross-sectional view of the substrate processing apparatus 100 of FIG. 1, and FIG. 4 is a side cross-sectional view of the substrate processing apparatus 100 of FIG. 1.

Initially, as shown in FIGS. 1 to 4, the substrate processing apparatus 100 according to some embodiments of the present invention may mainly include a load port module 10, a transfer robot 20, a dual adaptor, a controller 30, and a test module 40.

For example, the load port module 10 may be a module onto which a first carrier C1 in which first substrates W1 are stored is primarily loaded, and be provided with a load port stage corresponding to a bottom surface of the first carrier C1, and a shutter corresponding to an openable front surface of the first carrier C1.

Specifically, for example, the load port module 10 may be a single load port module loaded with only one carrier at a time to reduce a footprint of equipment.

However, the load port module 10 is not limited to the single load port module and may also use a dual or multi load port module.

Therefore, carriers storing substrates may be loaded onto and unloaded from the apparatus one by one by using the load port module 10.

For example, the transfer robot 20 may be a kind of transfer device capable of transferring the first substrates W1 from the first carrier C1 to the dual adaptor or the test module 40, and be mounted between the load port module 10 and the dual adaptor or between the load port module 10 and the test module 40.

The transfer robot 20 is not limited to the illustration and may use any of various types of robots or transfer devices capable of lifting a substrate from a bottom surface and transferring the same to a desired place by using a transfer arm or the like.

For example, the dual adaptor may be a kind of buffer or stage structure inside the apparatus, which has a capacity to store all substrates which were stored in two or more carriers.

For example, when up to 25 substrates are stored in each carrier, the dual adaptor may have a capacity to store 50 substrates or more.

Specifically, the dual adaptor may include a first adaptor region A primarily temporarily storing the first substrates W1 transferred by the transfer robot 20, and a second adaptor region B secondarily temporarily storing second substrates W2 transferred by the transfer robot 20 from a second carrier C2 secondarily loaded onto the load port module 10 after the first carrier C1 is unloaded from the load port module 10.

Herein, the first and second adaptor regions A and B may be integrally provided in one body or mounted in separate bodies, and be rotated by a rotating device 50 or lifted by a lifting device 60 separately or together.

For example, the first adaptor region A may store a number of substrates greater than or equal to the maximum number of first substrates W1 stored in the first carrier C1, and the second adaptor region B may store a number of substrates greater than or equal to the maximum number of second substrates W2 stored in the second carrier C2. For example, when up to 25 substrates are stored in each carrier, the first adaptor region A may have a capacity to store 25 substrates or more and the second adaptor region B may also have a capacity to store 25 substrates or more.

Therefore, when the dual adaptor is used, after all the first substrates W1 which were stored in the first carrier C1 loaded onto the load port module 10 are transferred to the first adaptor region A, the first carrier C1 may be unloaded from the load port module 10, and then the second carrier C2 may be loaded onto the load port module 10 and all the second substrates W2 which were stored in the second carrier C2 may be transferred to the second adaptor region B.

For example, the controller 30 may be any of various control devices (e.g., a control circuit, a control board, an arithmetic unit, a central processing unit, a program-installed storage device, a microprocessor, an integrated circuit, a semiconductor chip, an electronic component, a control panel, an electronic communication terminal, a smartphone, a smart pad, a computer, a server computer, and a smart device) capable of applying control signals to and controlling the load port module 10, the transfer robot 20, the dual adaptor, and the test module 40.

Specifically, for example, the controller 30 may apply a first substrate transfer control signal to the transfer robot 20 to store the first substrates W1, which were temporarily stored in the first adaptor region A and on which a process is completed, in the empty second carrier C2.

For example, the controller 30 may apply a third substrate transfer control signal to the transfer robot 20 to transfer third substrates W3 from a third carrier C3 tertiarily loaded onto the load port module 10, to the empty first adaptor region A after the second carrier C2 is unloaded from the load port module 10.

For example, the controller 30 may apply a second substrate transfer control signal to the transfer robot 20 to store the second substrates W2, which were temporarily stored in the second adaptor region B and on which a process is completed, in the empty third carrier C3.

For example, the controller 30 may apply a second substrate transfer control signal to the transfer robot 20 to transfer the second substrates W2, which were temporarily stored in the second adaptor region B and on which a process is completed, to the first carrier C1 after the second carrier C2 is unloaded from the load port module and the empty first carrier C1 is loaded again.

The transfer robot 20 controlled by the controller 30 may be lifted or lowered from a height of the first carrier C1 seated on the load port module 10 to a height of the first adaptor region A or a height of the second adaptor region B.

Herein, the first and second adaptor regions A and B may be disposed in a vertical direction to reduce a footprint of equipment.

Meanwhile, for example, the test module 40 may be a test device for performing an electrical test process on the substrates by using a probe card 42 having a plurality of probes 41.

Therefore, the transfer robot 20 may transfer the first substrates W1 stored in the first adaptor region A, to the test module 40 and store the first substrates W1, on which a test process is completed, back in the first adaptor region A, or transfer the second substrates W2 stored in the second adaptor region B, to the test module 40 and store the second substrates W2, on which a test process is completed, back in the second adaptor region B.

Herein, for example, the first, second, and third substrates W1, W2, and W3 may be wafers, and the first, second, and third carriers C1, C2, and C3 may include at least one of cassettes, front opening unified pods (FOUPs), and front opening shipping boxes (FOSBs).

FIGS. 4 to 11 are side cross-sectional views showing operation of the substrate processing apparatus 100 of FIG. 1 step by step.

The operation of the substrate processing apparatus 100 according to some embodiments of the present invention will now be described in detail step by step with reference to FIGS. 4 to 11. Initially, as shown in FIG. 4, the first carrier C1 in which the first substrates W1 are stored may be primarily loaded onto the load port module 10.

In this case, both the first and second adaptor regions A and B may be empty.

Figure 5:
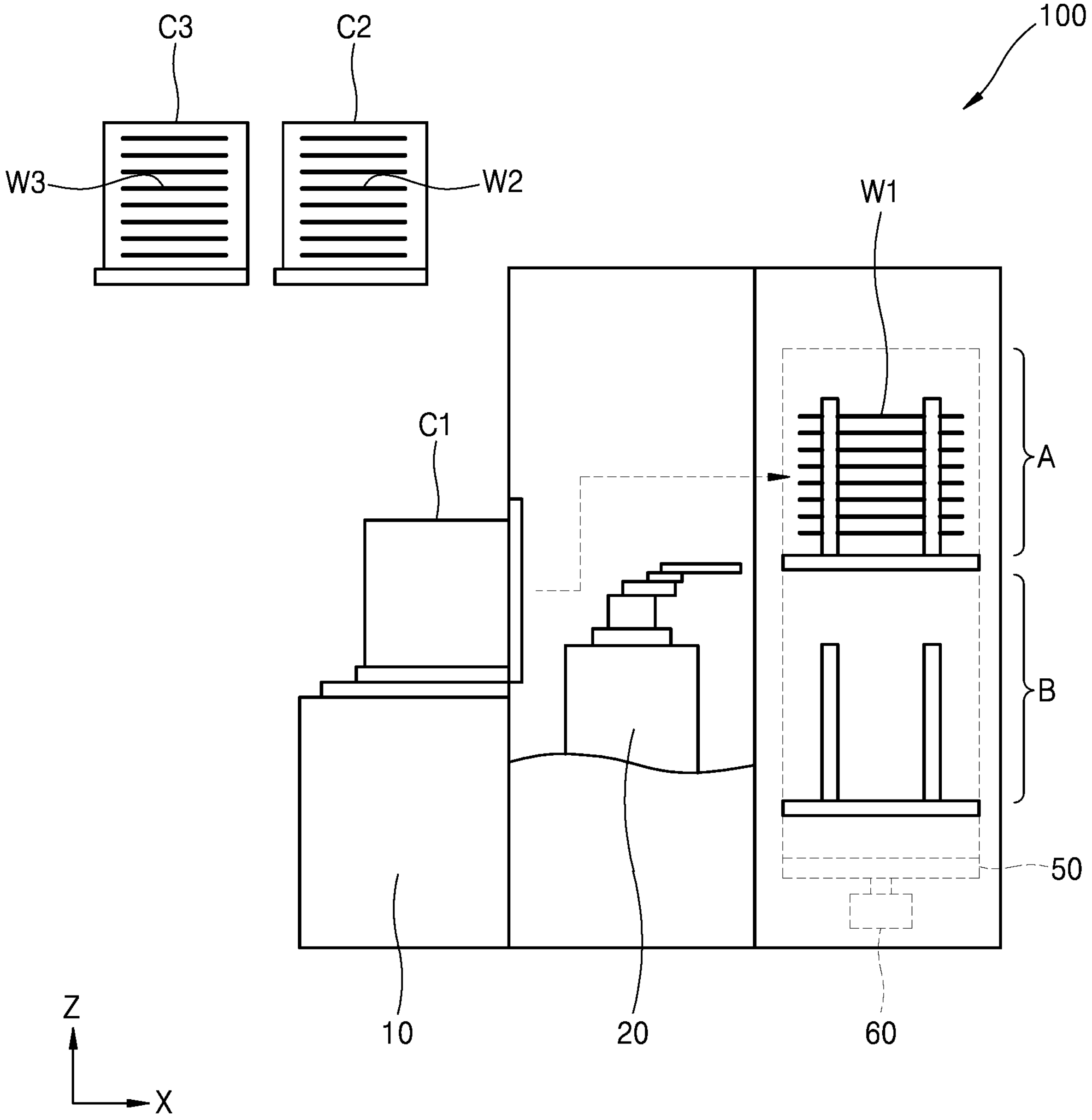

Then, as shown in FIG. 5, the transfer robot 20 may transfer the first substrates W1 from the first carrier C1 to the first adaptor region A.

In this case, the transfer robot 20 may be lifted or lowered from a height of the first carrier C1 seated on the load port module 10 to a height of the first adaptor region A to transfer the first substrates W1.

Herein, although the first adaptor region A is mounted at an upper side and the second adaptor region B is mounted at a lower side in the drawings, the first and second adaptor regions A and B are not limited to thereto and may be mounted in various ways. For example, the first adaptor region A may be mounted at a lower side and the second adaptor region B may be mounted at an upper side.

At this time, as shown in FIG. 3, a first test mode may be started. The transfer robot 20 may transfer the first substrates W1 of the first adaptor region A to the test module 40, and the test module 40 may perform an electrical test process on the first substrates W1 of the first adaptor region A by using the probe card 42 having the plurality of probes 41.

Figure 6:
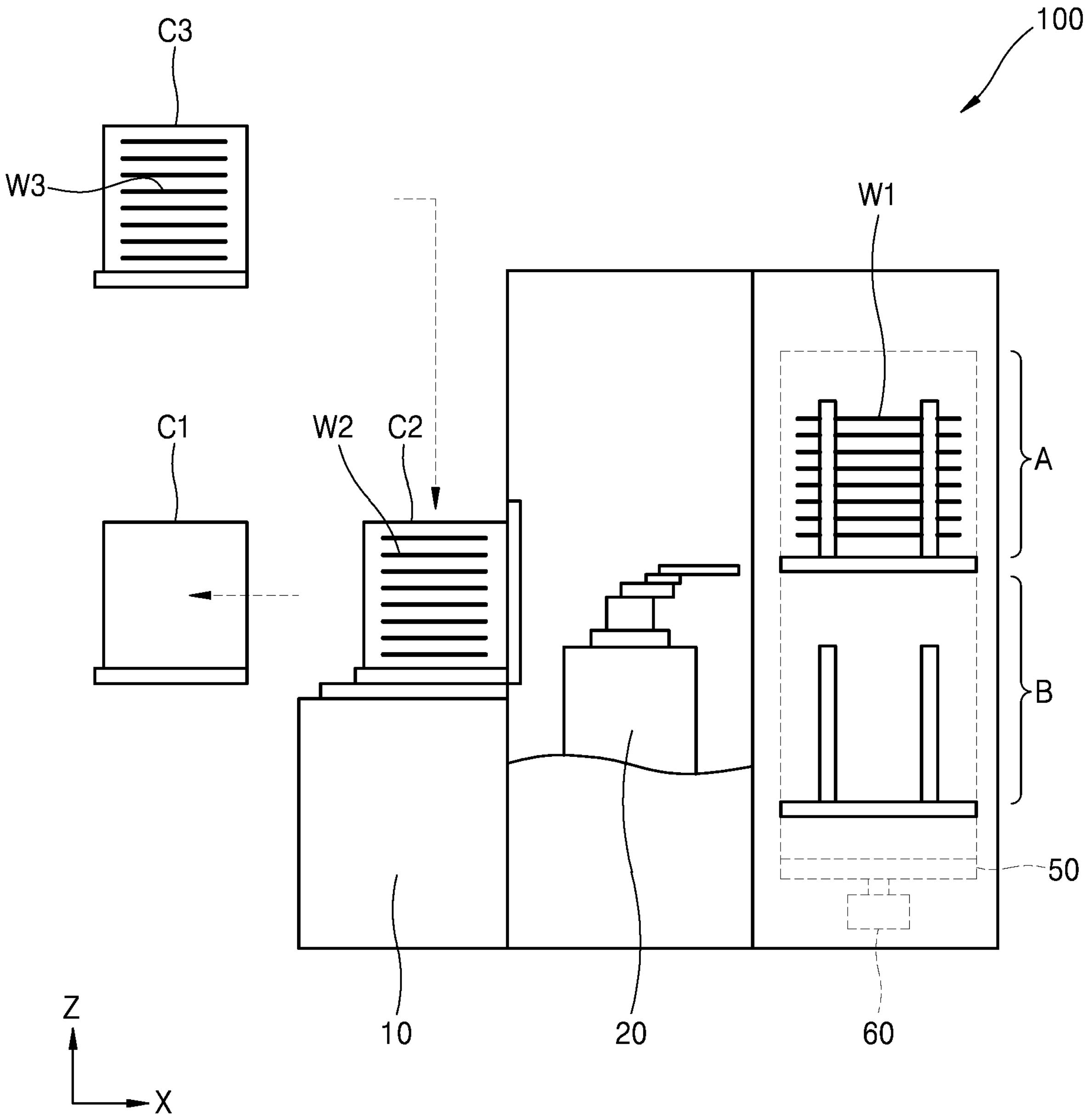

Then, as shown in FIG. 6, the empty first carrier C1 may be unloaded from the load port module 10, and the new second carrier C2 in which the second substrates W2 are stored may be secondarily loaded onto the load port module 10.

Figure 7:
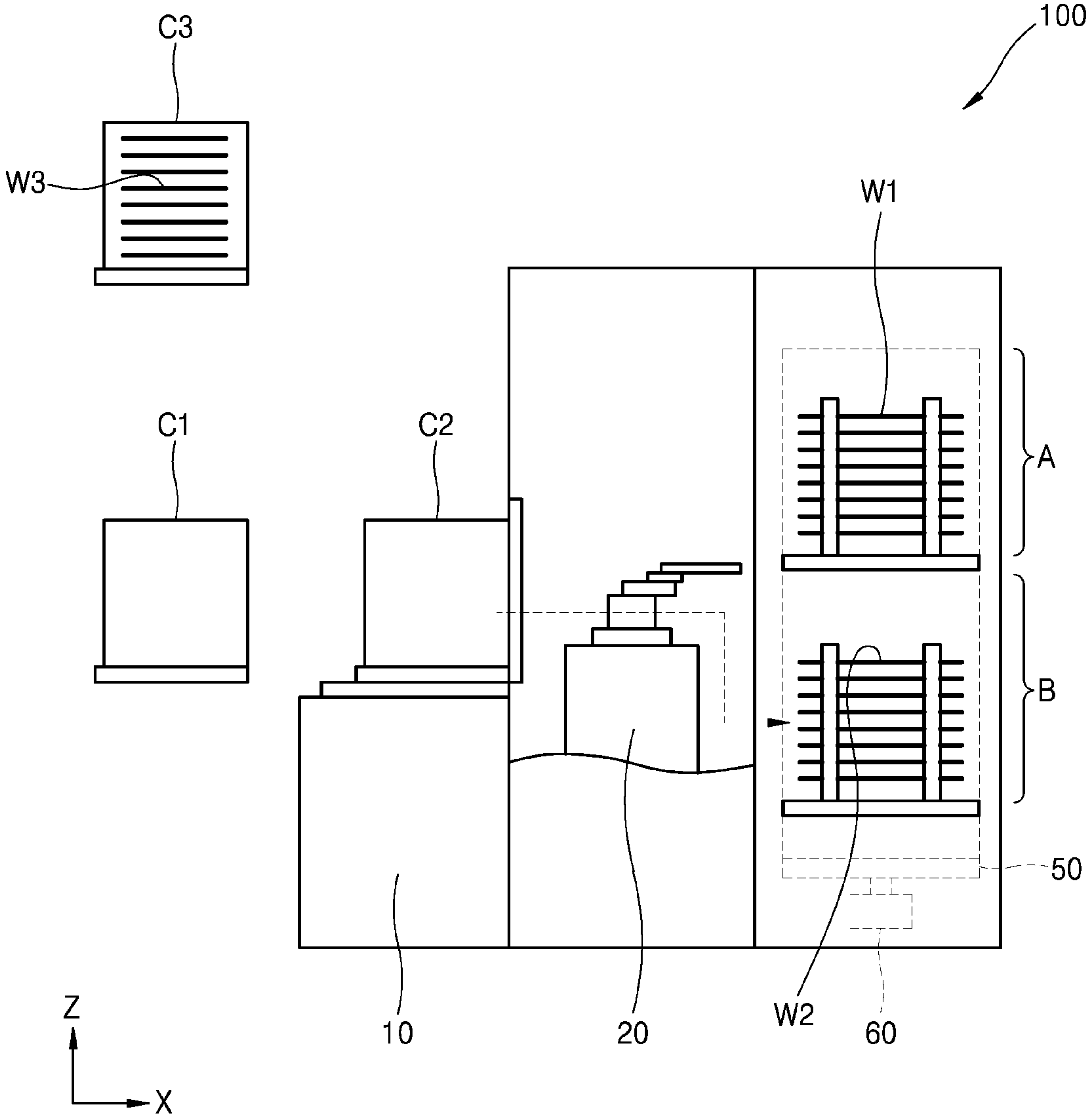

Then, as shown in FIG. 7, the transfer robot 20 may transfer the second substrates W2 from the second carrier C2 to the second adaptor region B.

In this case, the transfer robot 20 may be lifted or lowered from a height of the second carrier C2 seated on the load port module 10 to a height of the second adaptor region B to transfer the second substrates W2.

At this time, as shown in FIG. 3, a second test mode may be started. The transfer robot 20 may transfer the second substrates W2 of the second adaptor region B to the test module 40, and the test module 40 may perform an electrical test process on the second substrates W2 of the second adaptor region B by using the probe card 42 having the plurality of probes 41.

Herein, the transfer robot 20 may transfer the first substrates W1 stored in the first adaptor region A, to the test module 40 and store the first substrates W1, on which a test process is completed, back in the first adaptor region A.

Figure 8:
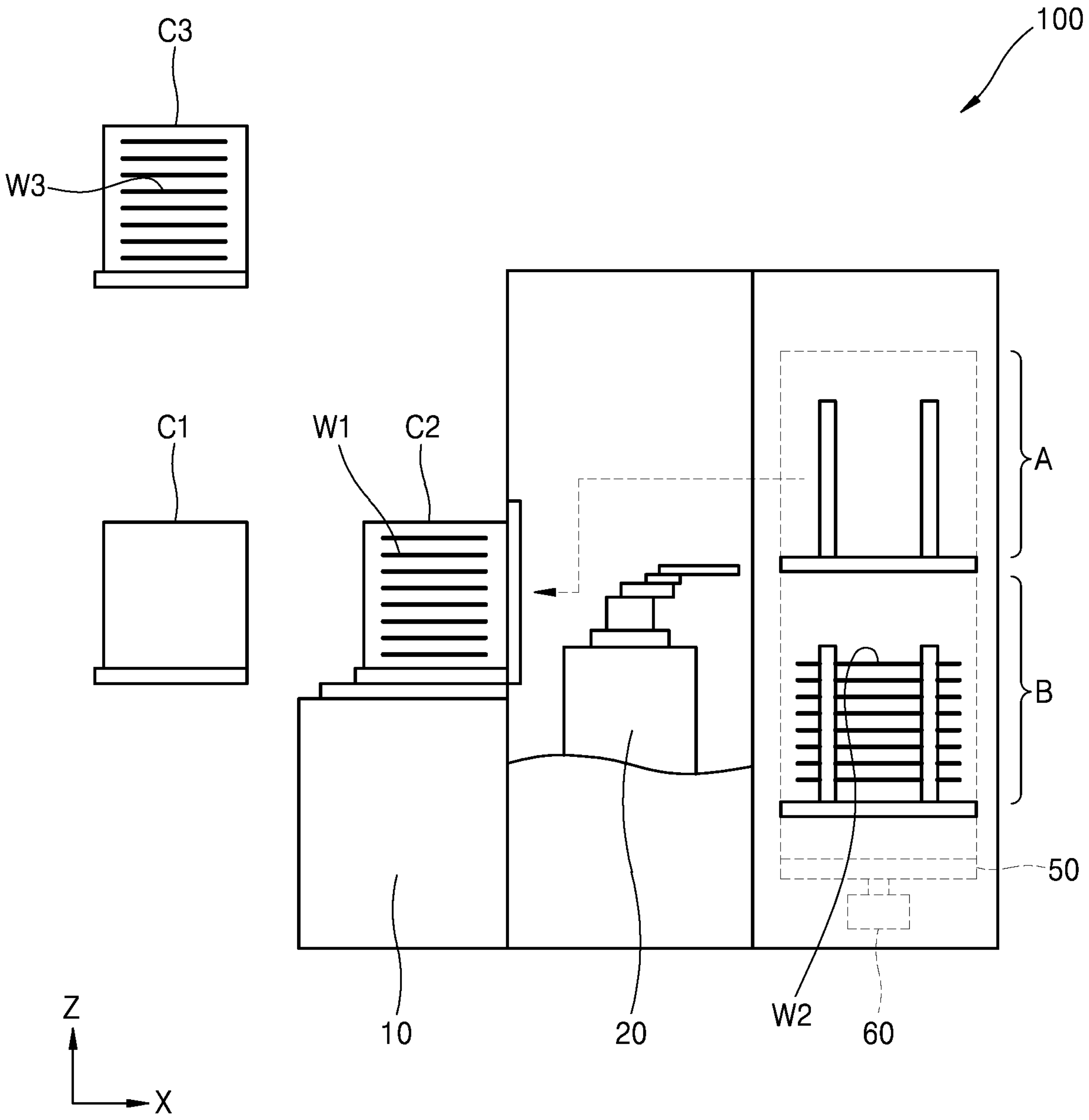

Then, as shown in FIG. 8, the transfer robot 20 may transfer the first substrates W1 of the first adaptor region A, on which a process is completed, to the empty second carrier C2.

That is, the first substrates W1 on which a test is completed may not come back home to the first carrier C1 where they were originally stored, but stored in the new second carrier C2 instead.

Figure 9:
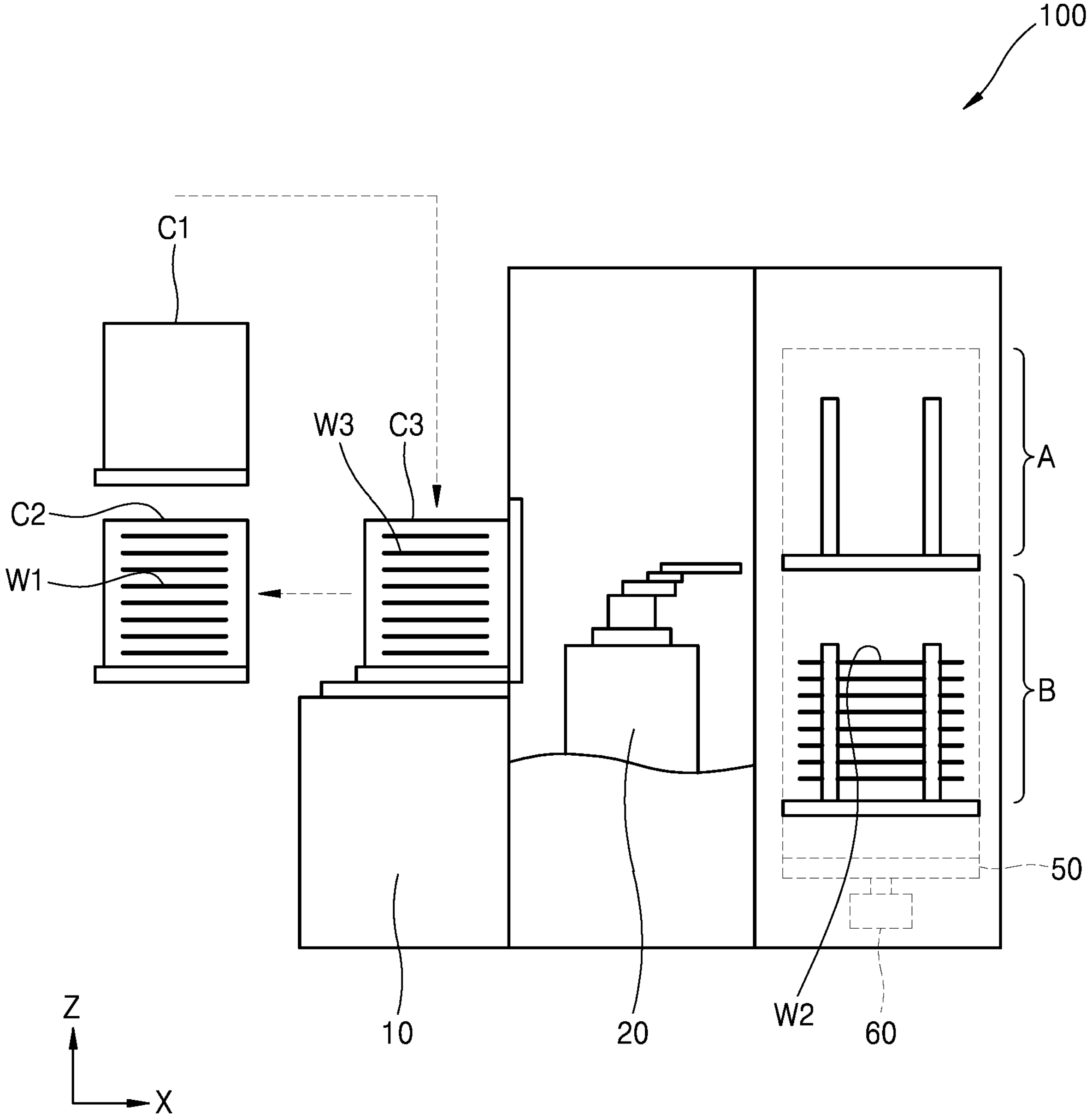

Then, as shown in FIG. 9, the second carrier C2 may be unloaded from the load port module 10, and the new third carrier C3 in which the third substrates W3 are stored may be tertiarily loaded onto the load port module 10.

Figure 10:
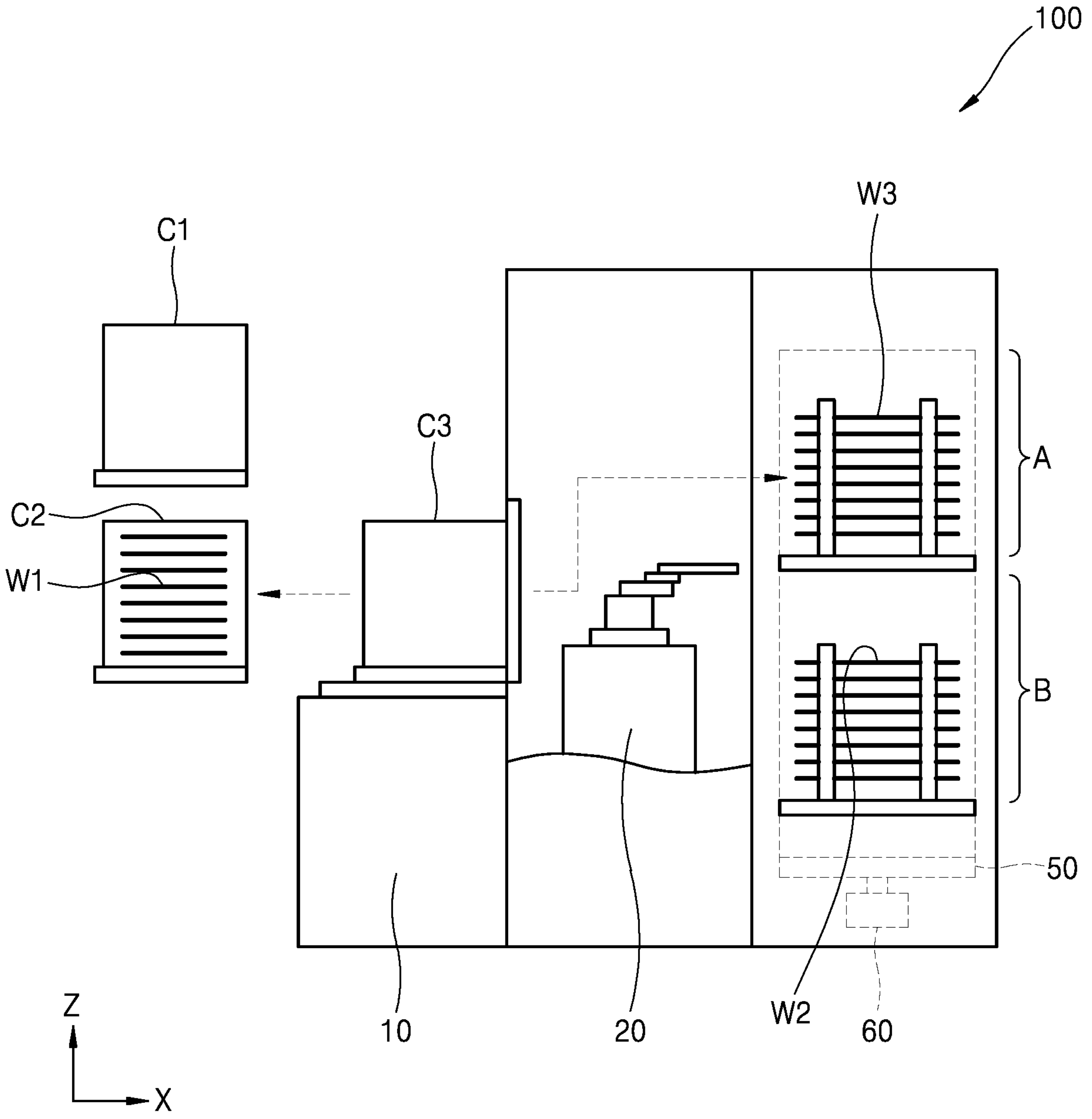

Then, as shown in FIG. 10, the transfer robot 20 may transfer the third substrates W3 from the third carrier C3 to the empty first adaptor region A.

Figure 11:
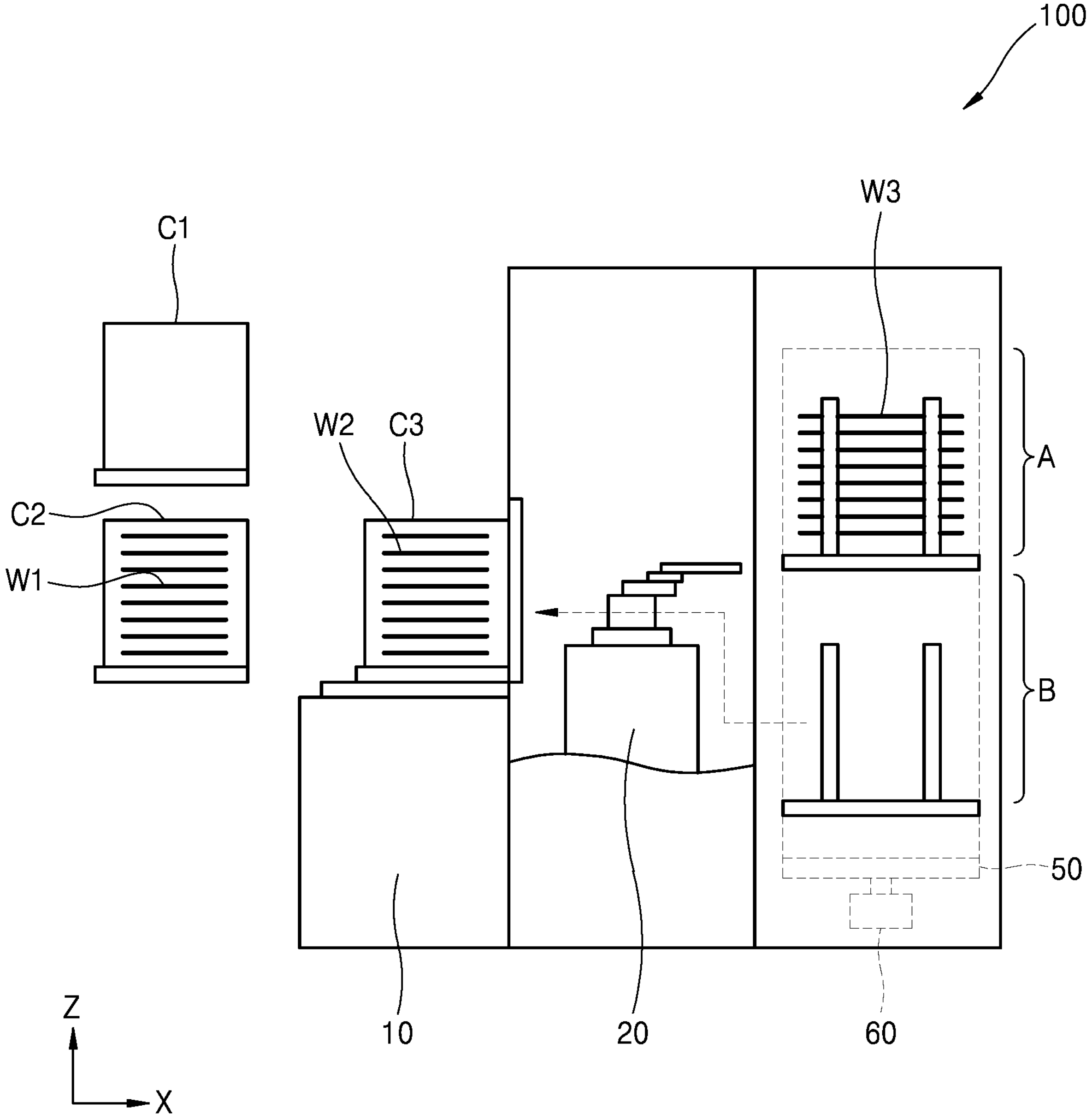

Then, as shown in FIG. 11, the transfer robot 20 may transfer the second substrates W2 of the second adaptor region B, on which a process is completed, to the empty third carrier C3.

Therefore, although the initial first carrier C1 may be empty, the first substrates W1 may be ultimately stored in the second carrier C2 and the second substrates W2 may be ultimately stored in the third carrier C3, and the above-described procedure may be repeated in a subsequent process.

Meanwhile, when a carrier size and a substrate size need to be matched, as shown in FIG. 9, after the second carrier C2 is unloaded from the load port module 10, the empty first carrier C1 may be loaded onto the load port module 10.

As such, the transfer robot 20 may transfer the second substrates W2 of the second adaptor region B, on which a process is completed, to the first carrier C1.

That is, in this case, the second substrates W2 may be ultimately stored in the first carrier C1 and the first substrates W1 may be ultimately stored in the second carrier C2.

Therefore, according to the present invention, because substrates are returned to a next carrier other than a carrier where the substrates were originally stored, and the function of a dual loader is performed with one load port module 10 by using an embedded dual adaptor, utilization of equipment may be increased, a footprint of the equipment may be minimized, carrier congestion may be prevented to greatly increase productivity, waste of cost due to installation of additional modules may be prevented, the number of carriers used may be reduced, and an internal transfer path, i.e., a loading and unloading path, of the substrates may be simplified.

Figure 12:
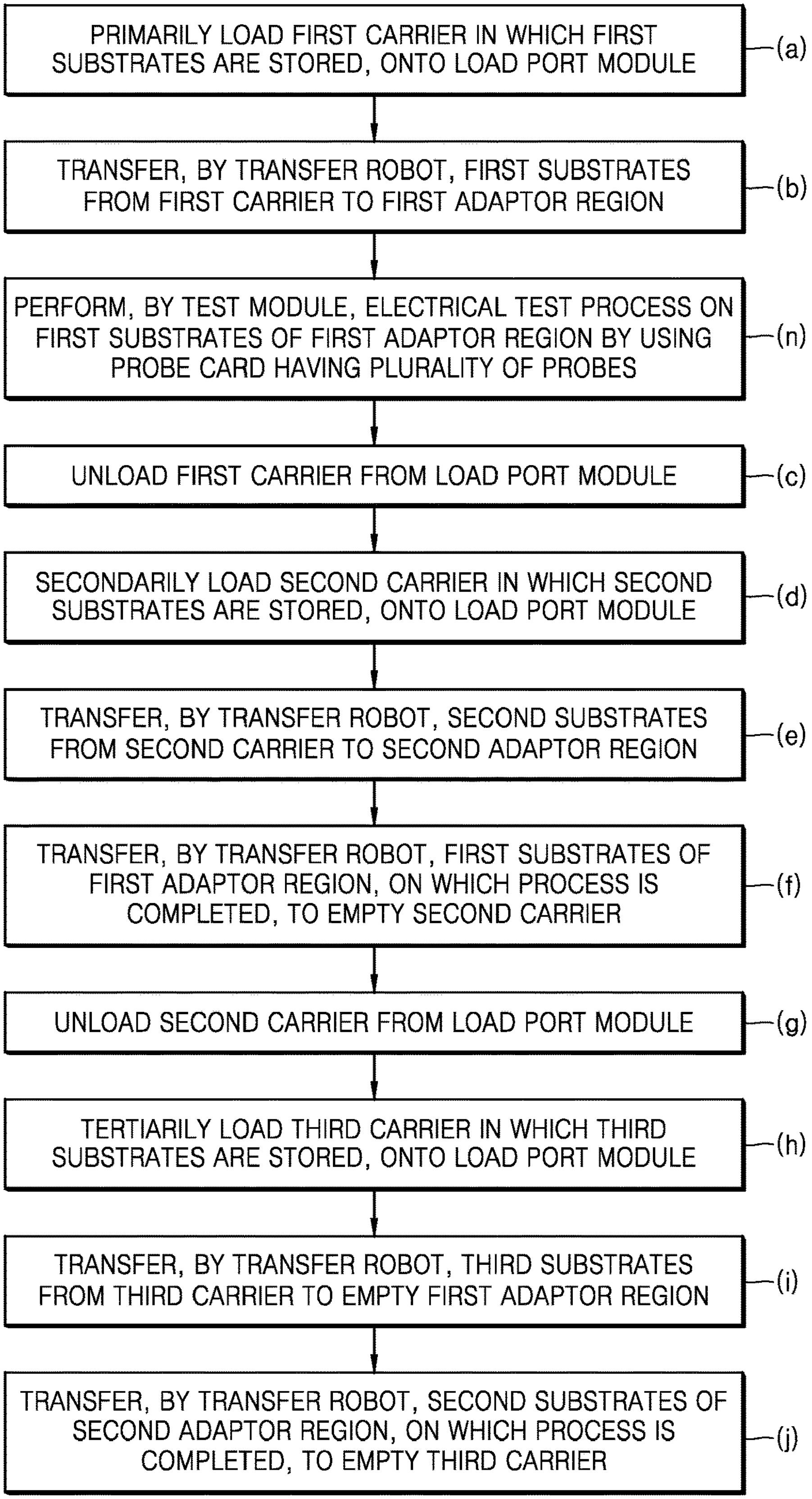
FIG. 12 is a flowchart of a substrate processing method according to some embodiments of the present invention.

FIG. 12 is a flowchart of a substrate processing method according to some embodiments of the present invention.

As shown in FIGS. 1 to 12, the substrate processing method according to some embodiments of the present invention may include (a) primarily loading the first carrier C1 in which the first substrates W1 are stored, onto the load port module 10, (b) transferring, by the transfer robot 20, the first substrates W1 from the first carrier C1 to the first adaptor region A, (n) performing, by the test module 40, an electrical test process on the first substrates W1 of the first adaptor region A by using the probe card 42 having the plurality of probes 41, (c) unloading the first carrier C1 from the load port module 10, (d) secondarily loading the second carrier C2 in which the second substrates W2 are stored, onto the load port module 10, (e) transferring, by the transfer robot 20, the second substrates W2 from the second carrier C2 to the second adaptor region B, (f) transferring, by the transfer robot 20, the first substrates W1 of the first adaptor region A, on which a process is completed, to the empty second carrier C2, (g) unloading the second carrier C2 from the load port module 10, (h) tertiarily loading the third carrier C3 in which the third substrates W3 are stored, onto the load port module 10, (i) transferring, by the transfer robot 20, the third substrates W3 from the third carrier C3 to the empty first adaptor region A, and (j) transferring, by the transfer robot 20, the second substrates W2 of the second adaptor region B, on which a process is completed, to the empty third carrier C3.

Herein, for example, in step (b), the transfer robot 20 may be lifted or lowered from a height of the first carrier C1 seated on the load port module 10 to a height of the first adaptor region A and, in step (e), the transfer robot 20 may be lifted or lowered from a height of the second carrier C2 seated on the load port module 10 to a height of the second adaptor region B.

For example, in step (n), the transfer robot 20 may transfer the first substrates W1 stored in the first adaptor region A, to the test module 40 and store the first substrates W1, on which a test process is completed, back in the first adaptor region A.

Figure 13:
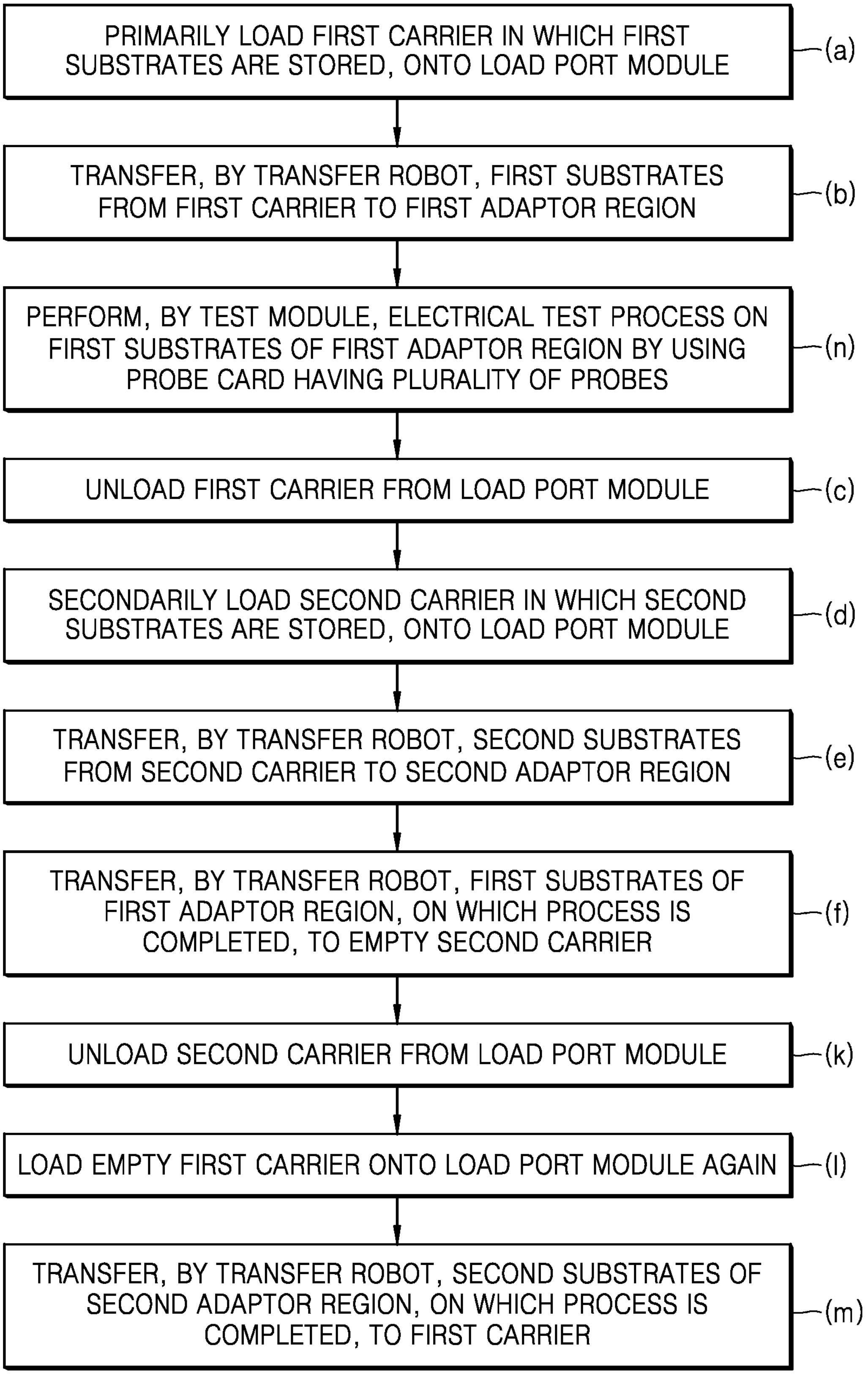
FIG. 13 is a flowchart of a substrate processing method according to other embodiments of the present invention.

FIG. 13 is a flowchart of a substrate processing method according to other embodiments of the present invention.

As shown in FIGS. 1 to 13, the substrate processing method according to other embodiments of the present invention may include (a) primarily loading the first carrier C1 in which the first substrates W1 are stored, onto the load port module 10, (b) transferring, by the transfer robot 20, the first substrates W1 from the first carrier C1 to the first adaptor region A, (n) performing, by the test module 40, an electrical test process on the first substrates W1 of the first adaptor region A by using the probe card 42 having the plurality of probes 41, (c) unloading the first carrier C1 from the load port module 10, (d) secondarily loading the second carrier C2 in which the second substrates W2 are stored, onto the load port module 10, (e) transferring, by the transfer robot 20, the second substrates W2 from the second carrier C2 to the second adaptor region B, (f) transferring, by the transfer robot 20, the first substrates W1 of the first adaptor region A, on which a process is completed, to the empty second carrier C2, (k) unloading the second carrier C2 from the load port module 10, (l) loading the empty first carrier C1 onto the load port module 10 again, and (m) transferring, by the transfer robot 20, the second substrates W2 of the second adaptor region B, on which a process is completed, to the first carrier C1.

Figure 14:
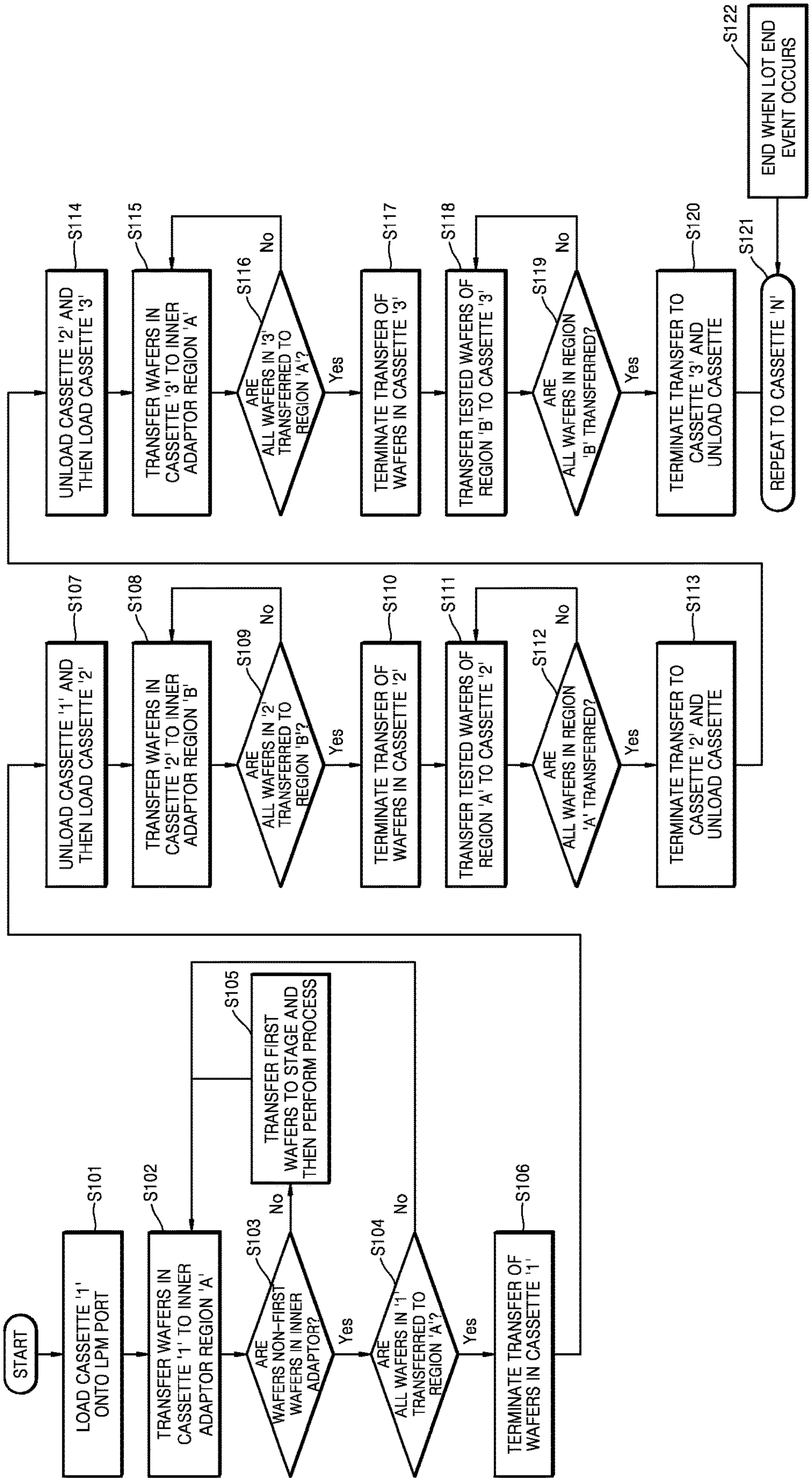
FIG. 14 is a flowchart of a substrate processing method according to other embodiments of the present invention.

FIG. 14 is a flowchart of a substrate processing method according to other embodiments of the present invention.

As shown in FIG. 14, initially, a cassette 1 (or first carrier) may be loaded onto a load port module (LPM) (S101), and wafers (or first substrates) in the cassette 1 may be transferred to a first adaptor A (or first adaptor region) (S102).

Then, it may be determined whether the wafers are the first wafers in the first adaptor A (S103). When the wafers are not the first wafers, it may be determined whether all wafers are transferred to the first adaptor A (S104). When the wafers are the first wafers, a process (test) may be performed on a stage (or test module) (S105). When all wafers are transferred, the transfer of the wafers (or first substrates) in the cassette 1 (or first carrier) may be terminated (S106).

Thereafter, the cassette 1 (or first carrier) may be unloaded and then a cassette 2 (or second carrier) may be loaded (S107), and wafers (or second substrates) in the cassette 2 may be transferred to a second adaptor B (or second adaptor region) (S108).

Then, it may be determined whether all wafers (or second substrates) in the cassette 2 (or second carrier) are transferred to the second adaptor B (S109), and the transfer of the wafers (or second substrates) in the cassette 2 (or second carrier) may be terminated (S110).

Then, the wafers (or first substrates) of the first adaptor A, on which a test is completed, may be transferred to the cassette 2 (or second carrier) (S111).

Subsequently, it may be determined whether all wafers (or first substrates) in the first adaptor A are transferred to the cassette 2 (or second carrier) (S112), and the transfer to the cassette 2 (or second carrier) may be terminated and then the cassette 2 (or second carrier) may be unloaded (S113).

Thereafter, the cassette 2 (or second carrier) may be unloaded and then a cassette 3 (or third carrier) may be loaded (S114), and wafers (or third substrates) in the cassette 3 may be transferred to the first adaptor A (S115).

Then, it may be determined whether all wafers (or third substrates) in the cassette 3 (or third carrier) are transferred to the first adaptor A (S116), and the transfer of the wafers (or third substrates) in the cassette 3 (or third carrier) may be terminated (S117).

Then, the wafers (or second substrates) of the second adaptor B, on which a test is completed, may be transferred to the cassette 3 (or third carrier) (S118).

Subsequently, it may be determined whether all wafers (or second substrates) in the second adaptor B are transferred to the cassette 3 (or third carrier) (S119), and the transfer to the cassette 3 (or third carrier) may be terminated and then the cassette 3 (or third carrier) may be unloaded (S120).

Then, the above-described procedure may be repeated to a cassette n (S121) and terminated when a lot end event occurs (S122).

Figure 15:
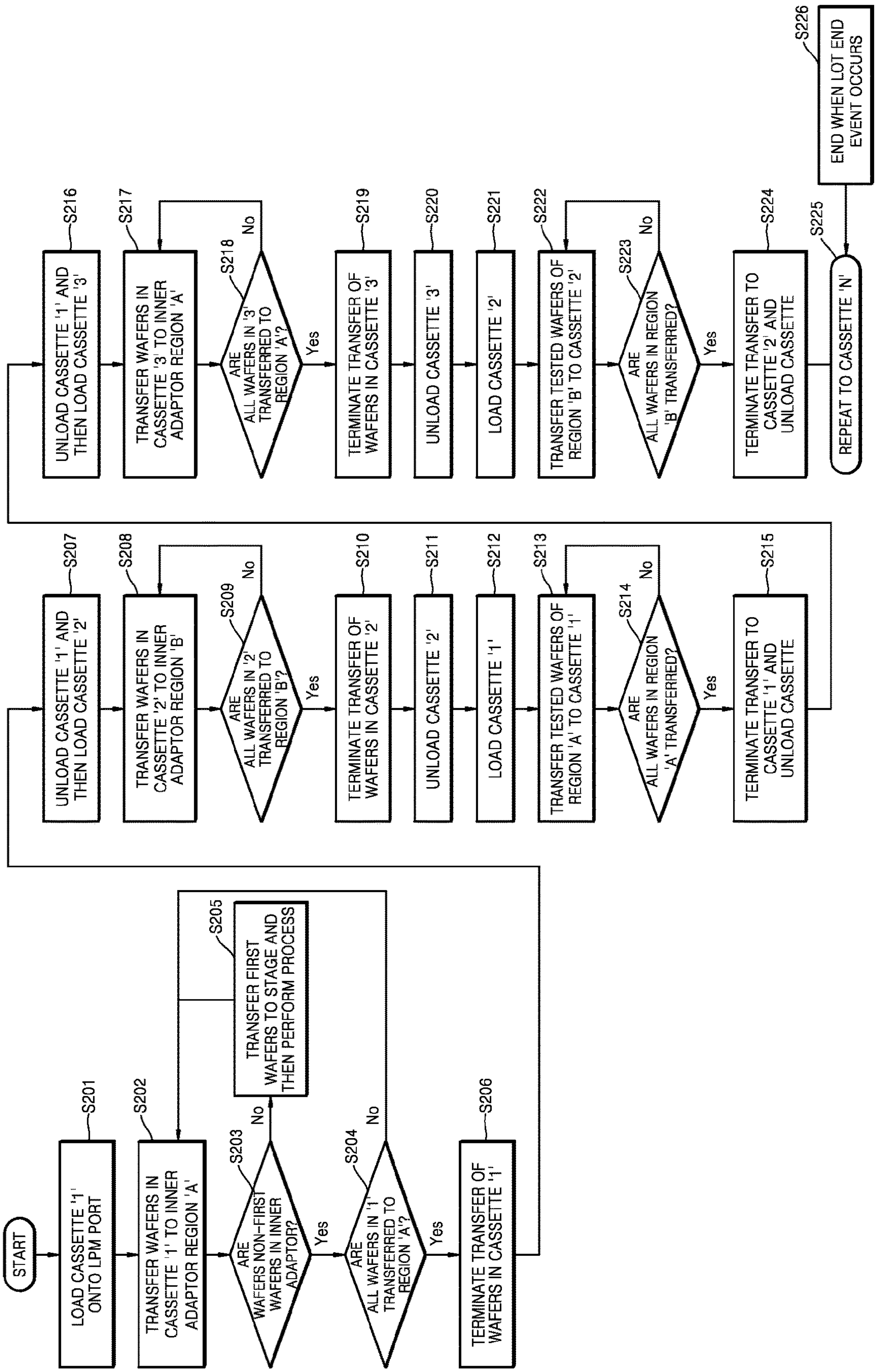
FIG. 15 is a flowchart of a substrate processing method according to other embodiments of the present invention.

FIG. 15 is a flowchart of a substrate processing method according to other embodiments of the present invention.

As shown in FIG. 15, initially, a cassette 1 (or first carrier) may be loaded onto a load port module (LPM) (S201), and wafers (or first substrates) in the cassette 1 may be transferred to a first adaptor A (S202).

Then, it may be determined whether the wafers are the first wafers in the first adaptor A (S203). When the wafers are not the first wafers, it may be determined whether all wafers are transferred to the first adaptor A (S204). When the wafers are the first wafers, a process (test) may be performed on a stage (or test module) (S205). When all wafers are transferred, the transfer of the wafers (or first substrates) in the cassette 1 (or first carrier) may be terminated (S206).

Thereafter, the cassette 1 (or first carrier) may be unloaded and then a cassette 2 (or second carrier) may be loaded (S207), and wafers (or second substrates) in the cassette 2 may be transferred to a second adaptor B (or second adaptor region) (S208).

Then, it may be determined whether all wafers (or second substrates) in the cassette 2 (or second carrier) are transferred to the second adaptor B (S209), and the transfer of the wafers (or second substrates) in the cassette 2 (or second carrier) may be terminated (S210).

Then, the cassette 2 (or second carrier) may be unloaded (S211).

Then, the cassette 1 (or first carrier) may be loaded again (S212), and the wafers (or first substrates) of the first adaptor A, on which a test is completed, may be transferred to the cassette 1 (or first carrier) (S213).

Subsequently, it may be determined whether all wafers (or first substrates) in the first adaptor A are transferred to the cassette 1 (or first carrier) (S214), and the transfer to the cassette 1 (or first carrier) may be terminated and then the cassette 1 (or first carrier) may be unloaded (S215).

Thereafter, the cassette 1 (or first carrier) may be unloaded and then a cassette 3 (or third carrier) may be loaded (S216), and wafers (or third substrates) in the cassette 3 may be transferred to the first adaptor A (S217).

Then, it may be determined whether all wafers (or third substrates) in the cassette 3 (or third carrier) are transferred to the first adaptor A (S218), and the transfer of the wafers (or third substrates) in the cassette 3 (or third carrier) may be terminated (S219).

Then, the cassette 3 (or third carrier) may be unloaded (S220).

Then, the cassette 2 (or second carrier) may be loaded again (S221), and the wafers (or second substrates) of the second adaptor B, on which a test is completed, may be transferred to the cassette 2 (or second carrier) (S222).

Subsequently, it may be determined whether all wafers (or second substrates) in the second adaptor B are transferred to the cassette 2 (or second carrier) (S223), and the transfer to the cassette 2 (or second carrier) may be terminated and then the cassette 2 (or second carrier) may be unloaded (S224).

Then, the above-described procedure may be repeated to a cassette n (S225) and terminated when a lot end event occurs (S226).

According to the afore-described embodiments of the present invention, because substrates are returned to a next carrier other than a carrier where the substrates were originally stored, and the function of a dual loader is performed with one load port module by using an embedded dual adaptor, utilization of equipment may be increased, a footprint of the equipment may be minimized, carrier congestion may be prevented to greatly increase productivity, waste of cost due to installation of additional modules may be prevented, the number of carriers used may be reduced, and an internal transfer path, i.e., a loading and unloading path, of the substrates may be simplified. However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A substrate processing apparatus comprising:

a load port module loaded with a first carrier in which first substrates are stored;

a transfer robot configured to transfer the first substrates from the first carrier to a first adaptor region;

the first adaptor region being configured to receive and temporarily store the first substrates transferred by the transfer robot;

a second adaptor region configured to receive and temporarily store second substrates transferred by the transfer robot from a second carrier loaded onto the load port module, after the first carrier is unloaded from the load port module; and a controller configured to apply a first substrate transfer control signal to the transfer robot to store the first substrates, which were temporarily stored in the first adaptor region and on which a process is completed, in the second carrier after second substrates are transferred from the second carrier to the second adaptor region, wherein the first adaptor region is rotated by a rotating device or lifted by a lifting device.

2. The substrate processing apparatus of claim 1, wherein the controller is configured to apply a third substrate transfer control signal to the transfer robot to transfer third substrates from a third carrier loaded onto the load port module, to the first adaptor region, after the second carrier is unloaded from the load port module.

3. The substrate processing apparatus of claim 2, wherein the controller is configured to apply a second substrate transfer control signal to the transfer robot to store the second substrates, which were temporarily stored in the second adaptor region and on which a process is completed, in the third carrier after third substrates are transferred from the third carrier to the first adaptor region.

4. The substrate processing apparatus of claim 1, wherein the controller is configured to apply a second substrate transfer control signal to the transfer robot to transfer the second substrates, which were temporarily stored in the second adaptor region and on which a process is completed, to the first carrier after the second carrier is unloaded from the load port module and the first carrier is loaded a second time.

5. The substrate processing apparatus of claim 1, wherein the load port module is a single load port module loaded with only one carrier at a time to reduce a footprint of equipment.

6. The substrate processing apparatus of claim 1, wherein the transfer robot is capable of being lifted or lowered from a height of the first carrier seated on the load port module to a height of the first adaptor region or a height of the second adaptor region.

7. The substrate processing apparatus of claim 1, wherein the first and second adaptor regions are disposed in a vertical direction to reduce a footprint of equipment.

8. The substrate processing apparatus of claim 1, further comprising a test module configured to perform an electrical test process on the substrates by using a probe card having a plurality of probes.

9. The substrate processing apparatus of claim 8, wherein the transfer robot is capable of transferring the first substrates stored in the first adaptor region, to the test module and storing the first substrates, on which a test process is completed, back in the first adaptor region, or transferring the second substrates stored in the second adaptor region, to the test module and storing the second substrates, on which a test process is completed, back in the second adaptor region.

10. The substrate processing apparatus of claim 1, wherein the first substrates or the second substrates are wafers, and wherein the first or second carrier comprises at least one of a cassette, a front opening unified pod (FOUP), and a front opening shipping box (FOSB).

11. The substrate processing apparatus of claim 1, wherein the first adaptor region is capable of storing a number of substrates greater than or equal to a maximum number of first substrates stored in the first carrier.

12. A substrate processing method comprising:

(a) primarily loading a first carrier in which first substrates are stored, onto a load port module;

(b) transferring, by a transfer robot, the first substrates from the first carrier to a first adaptor region;

(c) unloading the first carrier from the load port module;

(d) secondarily loading a second carrier in which second substrates are stored, onto the load port module;

(e) transferring, by the transfer robot, the second substrates from the second carrier to a second adaptor region; and (f) transferring, by the transfer robot, the first substrates of the first adaptor region, on which a process is completed, to the second carrier after second substrates are transferred from the second carrier to the second adaptor region.

13. The substrate processing method of claim 12, further comprising:

(g) unloading the second carrier from the load port module;

(h) tertiarily loading a third carrier in which third substrates are stored, onto the load port module; and (i) transferring, by the transfer robot, the third substrates from the third carrier to the first adaptor region, after step (f).

14. The substrate processing method of claim 13, further comprising (j) transferring, by the transfer robot, the second substrates of the second adaptor region, on which a process is completed, to the third carrier, after step (i).

15. The substrate processing method of claim 12, further comprising:

(k) unloading the second carrier from the load port module;

(l) loading the first carrier onto the load port module a second time; and (m) transferring, by the transfer robot, the second substrates of the second adaptor region, on which a process is completed, to the first carrier, after step (f).

16. The substrate processing method of claim 12, wherein, in step (b), the transfer robot is lifted or lowered from a height of the first carrier seated on the load port module to a height of the first adaptor region, and wherein, in step (e), the transfer robot is lifted or lowered from a height of the second carrier seated on the load port module to a height of the second adaptor region.

17. The substrate processing method of claim 12, further comprising (n) performing, by a test module, an electrical test process on the first substrates of the first adaptor region by using a probe card having a plurality of probes, after step (b).

18. The substrate processing method of claim 17, wherein, in step (n), the transfer robot transfers the first substrates stored in the first adaptor region, to the test module and stores the first substrates, on which a test process is completed, back in the first adaptor region.

19. A substrate processing apparatus comprising:

a load port module loaded with a first carrier in which first substrates are stored;

a transfer robot configured to transfer the first substrates from the first carrier;

a first adaptor region configured to receive and temporarily store the first substrates transferred by the transfer robot to the first adaptor region;

a second adaptor region configured to receive and temporarily store second substrates transferred by the transfer robot from a second carrier loaded onto the load port module, after the first carrier is unloaded from the load port module; and a controller configured to apply a first substrate transfer control signal to the transfer robot to store the first substrates, which were temporarily stored in the first adaptor region and on which a process is completed, in the second carrier after second substrates are transferred from the second carrier to the second adaptor region, wherein the controller:

is configured to apply a third substrate transfer control signal to the transfer robot to transfer third substrates from a third carrier loaded onto the load port module, to the first adaptor region after the second carrier is unloaded from the load port module; and is configured to apply a second substrate transfer control signal to the transfer robot to store the second substrates, which were temporarily stored in the second adaptor region and on which a process is completed, in the third carrier after the third substrates are transferred to the first adaptor region; or is configured to apply a second substrate transfer control signal to the transfer robot to transfer the second substrates, which were temporarily stored in the second adaptor region and on which a process is completed, to the first carrier after the second carrier is unloaded from the load port module and the first carrier is loaded a second time, wherein the first adaptor region is rotated by a rotating device or lifted by a lifting device.

* * * * *